United States Patent [19]

Kremlev et al.

[11] 4,175,240
[45] Nov. 20, 1979

[54] INTEGRATED LOGIC CIRCUIT WITH A CURRENT SOURCE MADE AS A FIELD-EFFECT TRANSISTOR

[76] Inventors: Vyacheslav Y. Kremlev, korpus 423, kv. 81; Artashes R. Nazarian, ploschad Junosti, 3, kv. 16; Alexei V. Lubashevsky, ploschad Junosti, 4, kv. 10; Vilyam N. Kokin, korpus 441, kv. 115, all of Moscow, U.S.S.R.

[21] Appl. No.: 866,626

[22] Filed: Jan. 3, 1978

[30] Foreign Application Priority Data

Jan. 10, 1977 [SU] U.S.S.R. .............................. 2441813[I]
Jan. 10, 1977 [SU] U.S.S.R. .............................. 2441910

[51] Int. Cl.² .................... H03K 19/08; H03K 19/34; H03K 19/36; H03K 19/40
[52] U.S. Cl. .................... 307/205; 307/213; 307/214; 307/215; 357/22; 357/92
[58] Field of Search .............. 307/205, 213, 203, 214, 307/215; 357/92, 22

[56] References Cited

U.S. PATENT DOCUMENTS

| | | | |
|---|---|---|---|
| 4,035,664 | 7/1977 | Berger et al. | 307/213 X |
| 4,053,923 | 10/1977 | Kang | 357/92 X |
| 4,065,680 | 12/1977 | Russell | 307/213 X |

OTHER PUBLICATIONS

*Electronics*, "Junction Field-Effect Transistor Designed for Speedy Logic"; pp. 4E & 6E; 8/19/76.
Berger et al., "Advanced Merged Transistor Logic by Using Schottky Junctions", *Microelectronics*, (pub.), vol. 7, No. 3, pp. 35–42; 1976.

*Primary Examiner*—Larry N. Anagnos
*Attorney, Agent, or Firm*—Lackenbach, Lilling & Siegel

[57] ABSTRACT

The integrated logic circuit of the invention comprises a switching field-effect transistor and a current source, which is another field-effect transistor having its conductivity complementary to that of the switching field-effect transistor. The second field-effect transistor has its gate coupled to the source of the switching field-effect transistor, and to an electrode of a power supply its source coupled to the other power supply circuit electrode and its drain coupled to the gate of the switching field-effect transistor. The gate and the drain of the switching field-effect transistor are respectively connected to the input and the output of the circuit.

7 Claims, 7 Drawing Figures

INTEGRATED LOGIC CIRCUIT WITH A CURRENT SOURCE MADE AS A FIELD-EFFECT TRANSISTOR

FIELD OF THE INVENTION

This invention relates to microelectronics and, more particularly to, LSI integrated logic circuits.

The invention is applicable to digital computers and, for example, to microprocessors.

DESCRIPTION OF THE PRIOR ART

There are integrated logic circuits known in the art as "injection" circuits which comprise a pair of bipolar transistors, one of which is a switching transistor and the other of which operates as a current source.

There is also an integrated logic circuit which resembles that of the invention and comprises a switching field-effect transistor, a current source (bipolar transistor) coupled to the switching field-effect transistor, input and output electrodes coupled, respectively, to the gate and to the drain of the switching field-effect transistor, and a pair of power supply circuit electrodes, one of which being coupled to the current source, and the other being coupled to the source of the switching field-effect transistor (U.S.S.R. Author's certificate No. 597094).

The described circuit features a relatively high value of the supply voltage and a great amount of switching energy. This is due to the fact that the bipolar transistor used as a current source has a small emitter-to-collector current transfer ratio and a relatively high conducting voltage across the emitter junction equal to approximately 0.7 V.

BRIEF DESCRIPTION OF THE INVENTION

It is an object of the invention to provide an integrated logic circuit which requires lower supply voltage and switching energy.

Another object of the invention is to provide for simpler fabricating techniques for the proposed integrated logic circuit and to minimize its area.

According to the invention, there is provided an integrated logic circuit comprising a switching field-effect transistor, a current source coupled to the transistor, input and output electrodes coupled, respectively, to the gate and to the drain of the transistor, and power supply circuit electrodes, one of which being coupled to the current source and the other being coupled to the source of the transistor. The current source is made in the form of a field-effect transistor having its conductivity complementary to that of the switching field-effect transistor. It is provided with its gate coupled to the source of the switching field-effect transistor, with its source coupled to one of the power supply circuit electrodes and with its drain coupled to the gate of the switching field-effect transistor.

It is advantageous that the switching field-effect transistor comprise, for the purpose of broadening the functional capabilities of the integrated logic circuit, at least one additional gate coupled to an additional input electrode, and that the second field-effect transistor comprise additional drains whose number is equal to that of the additional gates.

It is preferable for creating multi-input integrated logic circuits that at least one additional field-effect transistor, having its conductivity complementary to that of the switching field-effect transistor be inserted between the drain of the second field-effect transistor and the gate of the switching field-effect transistor, the gates of the additional field-effect transistors being coupled to the source of the switching field-effect transistor.

Advantageously, in creating the semiconductor structure of the integrated logic circuit of the invention provided with a switching transistor in the form of a planar field-effect transistor with a pn junction, a vertical n(p)-channel and the source in the form of an n(p)-substrate of the integrated logic circuit and a current source is made as a field-effect structure with a pn junction and a horizontal p(n)-channel, the drain and the source regions of the current source being combined, respectively, with the gate region of the field-effect switching transistor and the substrate of the integrated logic circuit.

If the above-described semiconductor structure has its vertical n(p)-channel formed on a p(n)-substrate, the current source is made as a field-effect structure with a vertical p(n)-channel.

BRIEF DESCRIPTION OF THE DRAWINGS

Other features and advantages of the invention will appear from the following description of a preferred embodiment thereof in conjunction with the accompanying drawings in which.

DETAILED DESCRIPTION OF THE INVENTION

Figure 1:
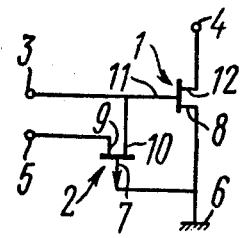
FIG. 1 is a circuit diagram of an integrated logic circuit used as an inverter, according to the invention.

FIG. 1 illustrates a circuit diagram of the simplest embodiment of the integrated logic circuit of the invention, which is an inverter. The inverter comprises a field-effect transistor 1 with an n-channel; a current source 2 made as a field-effect transistor (hereinafter referred to as transistor 2) with a p-channel and having, therefore, its conductivity complementary to that of the transistor 1, an input electrode 3; an output electrode 4; and power supply circuit electrodes 5 and 6.

A gate 7 of the transistor 2 is coupled to a source 8 of the transistor 1, a source 9 of the transistor 2 is coupled to the power supply circuit electrode 5, a drain 10 is coupled to a gate 11 of the transistor 1 and to the input electrode 3, and the grounded electrode 6 of a power supply circuit (not shown in the drawings) is coupled to the gate 7 of the transistor 2 and the source 8 of the transistor 1. A drain 12 of the transistor 1 is coupled to the output electrode 4.

Figure 2:
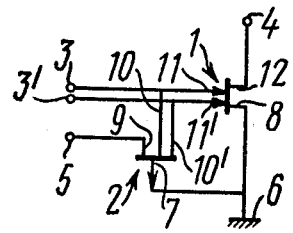
FIG. 2 is a circuit diagram of the integrated logic circuit, according to the invention, used as a logic gate configuration.

FIG. 2 illustrates a circuit diagram of another more sophisticated embodiment of the integrated logic circuit of the invention, which can be either a nor or a NAND gate. This circuit as compared to the inverter of FIG. 1, comprises an additional gate 11' for the transistor 1 coupled to an additional input electrode 3' and to an additional drain 10' of the transistor 2. The diagram of FIG. 2 incorporates one additional gate 11', but a greater number of gates may be provided using a connection method analogous to that for the gate 11' if more inputs are desired.

Figure 3:
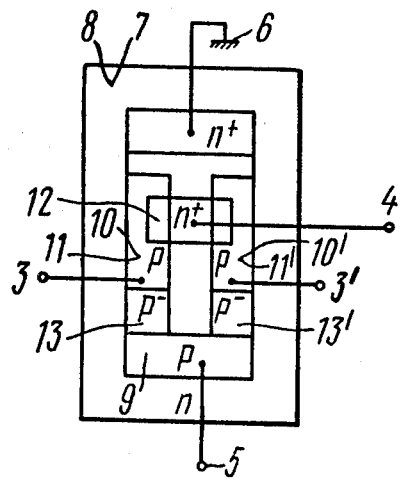
FIG. 3 is a top view of the semiconductor structure of the gate configuration of FIG. 2.

FIG. 3 shows diagrammatically a preferred embodiment of the semiconductor structure of the gate configuration of FIG. 2.

FIG. 3, as well as other figures depicting the semiconductor structure, uses the same reference numerals as those in respective circuit diagrams. The source 8 and the gate 7 are combined with an n-substrate of the integrated circuit. A diffusion region of p-type conductivity, which serves as a source 9, is formed in the substrate. Two p-regions adjacent to the diffusion region serve as channels 13 and 13' of a transistor 2. Adjacent to the two p-regions are another two p-regions which serve as gates 11 and 11' of a transistor 1 and as drains 10 and 10' of a transistor 2. Metallic contacts are formed on the last mentioned regions, which are coupled to input electrodes 3 and 3'. There are also two n-regions in the substrate. One of these regions partially overlaps the p-regions, serves as the drain 12 of the transistor 1 and is provided with a metallic contact coupled to an output electrode 4, while the other n regions forms an ohmic contact to the substrate and is coupled to the grounded electrode 6.

Figure 4:
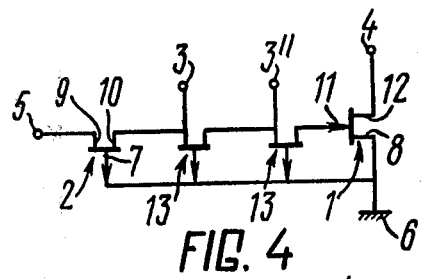
FIG. 4 is a circuit diagram of a two-input gate configuration, according to the invention.

As compared to the embodiment of FIG. 1, the circuit of the integrated logic circuit of the invention shown in FIG. 4 comprises two additional field-effect transistors 13 having conductivities complementary to that of the switching transistor 1. These transistors are connected in series to each other and inserted between a drain 10 of a transistor 2 and a gate 11 of the transistor 1. The source of the first additional transistor 13 is coupled to the input electrode 3 and the second additional transistor 13 is coupled to an additional input electrode 3".

Figure 5:
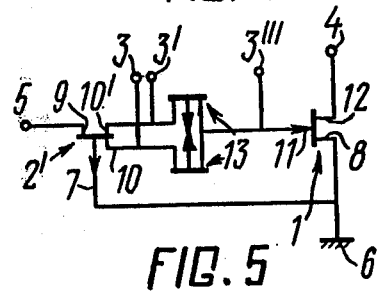
FIG. 5 is a circuit diagram of a three-input gate configuration, according to the invention.

A circuit of another embodiment of the integrated logic circuit of the inventions, shown in FIG. 5, comprises a transistor 2' with two drains 10 and 10'. Two parallel additional field-effect transistors 13 having their conductivities complementary to that of a switching transistor 1 are inserted between the drains 10 and 10' and the gate 11. An additional input electrode 3'" is coupled to the gate 11.

Figure 6:
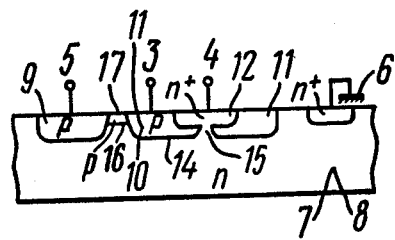
FIG. 6 is a vertical section of a semiconductor structure of an inverter with a current source in the form of a field-effect transistor with a horizontal channel.

FIG. 6 illustrates a semiconductor structure of the inverter shown in FIG. 1. A switching transistor 1 is implemented in the form of a planar structure with a pn junction 14, a vertical n-channel 15, a p-gate 11, and a source 8 combined with an n(p)-substrate of the integrated circuit. A current source is implemented as a field-effect structure with a pn junction 16 and a horizontal p-channel 17 whose drain region (drain 10) is combined with the gate region (gate 11) of the transistor 1, and whose gate region (gate 7) is coupled to the source region (source 8) of the transistor 1 and to a substrate 5 of the integrated circuit.

The above-described embodiment may utilize an n+ substrate (not shown in the drawings) provided with a high-resistance n-layer. In this case, the switching section comprises a field-effect transistor and an inverse bipolar transistor arrangement connected in parallel to each other.

Figure 7:
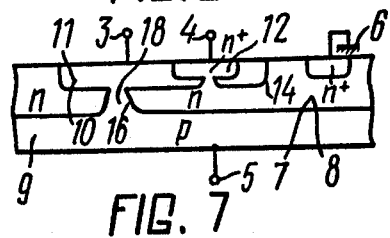
FIG. 7 shows the structure of FIG. 6 provided with a current source in the form of a field-effect transistor with a vertical channel.

FIG. 7 illustrates a semiconductor structure of the inverter of FIG. 6, which has a greater component density. As compared to the embodiment of FIG. 6, this stucture is provided with a p-substrate having its conductivity complementary to that of the source region 8 of the switching transistor 1, combined with the gate region 7 of the transistor 2. The current source is implemented as a field-effect structure with a vertical channel 18 and a source 9 combined with a p(n)-substrate of the integrated circuit. Since the source 9 is disposed in the substrate, a power supply circuit electrode 5 can be attached to the opposite surface of the structure, with the result that the area occupied by the integrated circuit decreases.

The integrated logic circuit of the invention, whose embodiments are illustrated by FIGS. 1, 6 and 7, operates as follows. A zero potential applied to the electrode 6 and, therefore, to the source 8 of the transistor 1 and to the gate 7 of the transistor 2 results in the appearance of a small positive voltage of 0.2 to 0.5 V across the source 9 of the transistor 2. At the same time, the supply current flows through the channel 17 from the source 9 to the drain 10 of the transistor 1 of the structure shown in FIG. 6. The transistor 2 works as a current source. If a zero voltage corresponding to logic 0 appears at the input electrode 3, then the supply current flows through an external circuit (coupled to the input electrode 3 and not shown in FIG. 1) to the ground. In this case, a zero voltage is present at the gate 11 of the transistor 1, the pn junction 14 is cut off and the channel 15 is pinched off by the space charge of the pn junction 14. This causes the transistor 1 to transfer to cutoff and a voltage, which is somewhat smaller than that at the electrode 5 (provided the output electrode 4 receives input from a similar component) and equal to 0.1–0.4 V, appears at the output electrode 4 to constitute logic 1. If logic 1 appears at the input electrode 3, then the supply current through the channel 17 of the transistor 2 passes via the pn junction 14 of the transistor 1 to the ground. Now, logic 1 appears at the gate 11, the transistor 1 begins to conduct and logic 0 appears at the output electrode 4 of the integrated circuit.

It can be seen that the simplest embodiment of the integrated logic circuit performs the logical operation "complement". The above-described integrated circuit can be used as an elementary component of LSI circuits intended for logic and storage devices, all the sources of such elementary components being combined with a common substrate. No special measures must be taken to isolate the components incorporated in these devices. LSI circuits composed of a plurality of inverters similar to that described above can be implemented on a single-chip semiconductor substrate having no epitaxial layer.

The semiconductor structure of FIG. 7 comprises the transistor 2 (current source) provided with the vertical channel 18, which allows the supply current for the integrated circuit to flow to the under side of the plate and to remove from the top side of the plate the metallization items of the power supply circuit. This facilitates the implementation of friction links in LSI circuits and provides for greater component density of them.

A more sophisticated embodiment of the integrated logic circuit of the invention is the gate configuration shown in FIGS. 2 and 3 which operates as follows. As in the case of the inverter configuration, positive (0.2–0.5 V) and zero potentials are applied to the electrodes 5 and 6, respectively, and supply currents flow through the channels 13 and 13' from the source 9 to the drains 10 and 10'. If logic 0 is present at the input electrodes 3 and 3', then the supply currents flowing through the channels 13 and 13' pass to the ground through external circuits coupled to the input electrodes 3 and 3' (these external circuits are not shown in FIGS. 2,3). A voltage almost equal to zero appears in this case at the gates 11 and 11', which results in a completely pinched off condition of the n-region located between the gate regions 11 and 11'. Now, the switching transistor 1 is cut off and logic 1 is present at the output electrode 4 of the integrated circuit.

If logic 1 appears at one of the input electrodes 3 and 3', for example, at the input electrode 3, then the supply current flows through the channel 13 of the current source to the pn junction of the gate region 11. Under these conditions, that portion of the n-region which is disposed between the gate portions 11 and 11' and is adjacent to the gate region 11 becomes free from the space charge, the transistor 1 is caused to conduct, and logic 0 appears at the output electrode 5 of the integrated circuit. Thus, the gate configuration performs the logical function NOR when the space between the gate regions 11 and 11' is equal to a doubled thickness of the layer of the space charge of the pn junction of the gate-source region.

The above-described gate configuration performs, however, the logical function NAND when the space between the gate regions 11 and 11' is less than or equal to the thickness of the layer of the space charge of the pn junction of the gate-source region. The switching transistor 1 is conducting and logic 0 appears at the output electrode 4 of the integrated circuit if and only if logic 1 appears at both input electrodes 3 and 3'. The appearance of any other combination of logic 0 and logic 1 at the input electrodes 3 and 3' will result in a pinched off condition of the n-region between the gate regions 11 and 11', resulted from the space charge.

The gate configuration shown in FIG. 4 performs the logical function NAND in the case of two input variables. Logic 0 appears at the output electrode 4 when logic 1's are present at both inputs 3 and 3'' concurrently. Any other combination of logic 0 and logic 1 at the input electrodes 3 and 3'' results in the appearance of logic 1 at the output electrode 4. For example, with logic 0 at the input electrode 3 and with logic 1 at the input electrode 3'', the supply current flowing through the drain region 10 of the transistor 2 passes through external circuits (not shown in FIG. 4) to the ground and does not reach the gate 11 of the switching transistor 1. As a result, the transistor 1 is cut off and logic 1 appears at its drain region 12 and, therefore, at the output electrode 4 of the gate configuration. The supply current also does not reach the gate region 11 of the transistor 1 when logic 0 appears either at the input electrode 3'' only or at the both input electrodes 3 and 3''.

The gate configuration shown in FIG. 5 performs the logical function c=a(b+d), where c is the logical variable at the output electrode 4 and a,b and d are logical variables at the input electrodes 3''', 3'' and 3, respectively. Logic 0 appears at the output electrode 4, which means that the logical variable c is 0, under the following conditions: the logical variable a is 1 and at least one of the other logical variables b and d is also 1. Any other combinations of the logical variables a,b and d result in a condition where the logical variable c is equal to 1.

All the gate configurations described above can be used for creation of complex digital logic and storage devices with direct links. The invention finds most useful applications in designing LSI circuits.

The integrated logic circuit of the invention can be implemented using simple fabricating techniques which involve two impurity diffusion operations performed with the help of three or four masks. Such a circuit formed, for example, on a single-chip substrate having no epitaxial layer and featuring a resistivity approximately equal to 10 ohm.cm occupies an area of several hundreds of $\mu m^2$, conventional masks with a minimal window size of 4 to 5 $\mu m$ being used for its fabrication. The product of the signal time delay and the power dissipation, known as the switching energy, is equal to $10^{-2}$ nJ in this circuit.

What is claimed is:

1. An integrated logic circuit comprising:
   a first field-effect transistor operating in a switching mode and having a gate, a drain and a source;
   a second field-effect transistor having its conductivity complementary to that of said first field-effect transistor, operating as a current source and having a gate, a drain and a source;
   an input electrode coupled to the gate of said first transistor and to the drain of said second transistor;
   an output electrode coupled to the drain of said first transistor;
   a first power supply circuit electrode coupled to the source of said second field-effect transistor; and
   a second power supply circuit electrode, which is grounded and coupled to the gate of said second transistor and to the source of said first transistor.

2. An integrated logic circuit as claimed in claim 1, further comprising:
   at least one additional gate of said first field-effect transistor;
   additional input electrodes whose number is equal to the number of said additional gates, each additional input electrode being coupled to a respective additional gate; and
   additional drains of said second field-effect transistor, whose number is equal to the number of said additional gates, coupled to a respective additional gate of said first field-effect transistor.

3. An integrated logic circuit as claimed in claim 2, further comprising:
   at least one additional field-effect transistor having its conductivity complementary to that of said first field-effect transistor and having a source coupled to the drain of said second field-effect transistor, a drain coupled to the gate of said first field-effect transistor, and a gate coupled to the source of said first field-effect transistor.

4. An integrated logic circuit as claimed in claim 2, wherein:
   said source of said first transistor and said gate of said second transistor are combined with an n-substrate of the circuit, said source of said second transistor is a diffusion region of p-type conductivity of said substrate, two p-regions adjacent to said diffusion region are channels of said transistor, said gates of said first transistor and said drains of said second transistor being made as additional p-regions, a first n-region in the substrate used as said drain of said first transistor and overlapping said p-regions, and a second n-region used as an ohmic contact of said substrate and connected to said second power supply circuit electrode.

5. An integrated logic circuit as claimed in claim 1, further comprising:
at least one additional field-effect transistor having its conductivity complementary to that of said first field-effect transistor and having a source coupled to the drain of said second field-effect transistor, a drain coupled to the gate of said first field-effect transistor, and a gate coupled to the source of said first field-effect transistor.

6. An integrated inverter comprising:
a first field-effect transistor operating in a switching mode and having a gate, a drain and a source;
a second field-effect transistor having its conductivity complementary to that of said first field-effect transistor, operating as a current source and having a gate, a drain and a source;
an input electrode coupled to the gate of said first transistor and to the drain of said second transistor;
an output electrode coupled to the drain of said first transistor;
a first power supply circuit electrode coupled to the source of said second transistor; and
a second power supply circuit electrode, which is grounded and coupled to the gate of said second transistor and to the source of said first transistor; wherein
said first transistor is made in the form of a planar field-effect structure with a pn junction, a vertical n(p)-channel and a source combined with an n(p)-substrate of the inverter; and wherein
said current source is made in the form of a field-effect structure with a pn junction, a horizontal p(n)-channel, a drain region combined with the gate region of said first transistor and a source region combined with said substrate.

7. An integrated inverter comprising:
a first field-effect transistor operating in a switching mode and having a gate, a drain and a source;
a second field-effect transistor having its conductivity complementary to that of said first transistor, operating as a current source and having a gate, a drain and a source;
an input electrode coupled to the gate of said first transistor and to the drain of said second transistor;
an output electrode coupled to the drain of said first transistor;
a first power supply circuit electrode coupled to the source of said second transistor; and
a second power supply circuit electrode, which is grounded and coupled to the gate of said second transistor and to the source of said first transistor; wherein
said first transistor is made as a field-effect planar structure with a pn junction and a vertical n(p)-channel formed on a p(n)-substrate; and wherein
said current source is made as a field-effect structure with a pn junction, a vertical p(n)-channel and a drain region combined with the gate region of said first transistor, and with a source region combined with said substrate.

* * * * *